United States Patent
Nozaki (10) Patent No.: US 9,553,598 B2
(45) Date of Patent: Jan. 24, 2017

(54) ANALOG-TO-DIGITAL CONVERTER AND SEMICONDUCTOR INTEGRATED CIRCUIT

(71) Applicant: Socionext Inc., Yokohama-shi, Kanagawa (JP)

(72) Inventor: Takeshi Nozaki, Sagamihara (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/850,472

(22) Filed: Sep. 10, 2015

(65) Prior Publication Data

US 2016/0087643 A1    Mar. 24, 2016

(30) Foreign Application Priority Data

Sep. 24, 2014  (JP) ................. 2014-194061

(51) Int. Cl.
  *H03M 1/06*    (2006.01)
  *H03M 1/08*    (2006.01)
  *H03M 1/12*    (2006.01)

(52) U.S. Cl.
  CPC ......... *H03M 1/0604* (2013.01); *H03M 1/0836* (2013.01); *H03M 1/1215* (2013.01)

(58) Field of Classification Search
  CPC .............................. H03M 1/0604; H03M 1/12
  USPC ................. 341/155, 118, 120, 122, 159, 164
  See application file for complete search history.

(56) References Cited

U.S. PATENT DOCUMENTS

| | | | |
|---|---|---|---|
| 7,916,050 B1 * | 3/2011 | Mujica ................. | H03M 1/004 341/118 |
| 8,294,605 B1 * | 10/2012 | Pagnanelli ............ | H03M 3/358 341/144 |
| 9,030,341 B2 * | 5/2015 | Tan ..................... | H03M 1/1052 341/118 |
| 2010/0197252 A1 * | 8/2010 | Tsukamoto ............ | H03D 1/00 455/142 |
| 2013/0027233 A1 | 1/2013 | Nozaki | |

(Continued)

FOREIGN PATENT DOCUMENTS

| JP | 2013-031055 A | 2/2013 |
|---|---|---|
| JP | 2013-074308 A | 4/2013 |
| JP | 2013-191956 A | 9/2013 |

OTHER PUBLICATIONS

Shafiq M. Jamal et al., "Calibration of Sample-Time Error in a Two-Channel Time-Interleaved Analog-to-Digital Converter," IEEE Transactions on Circuits and Systems-I, vol. 51, pp. 130-139, Jan. 2004.

(Continued)

*Primary Examiner* — Peguy Jean Pierre
(74) *Attorney, Agent, or Firm* — Arent Fox LLP (57) ABSTRACT

A time-interleaved analog-to-digital converter that samples an analog input signal at a sampling frequency and converts the analog input signal into a digital output signal is enabled to perform correction processing on an error by: converting the analog input signal into the digital output signal by a plurality of analog-to-digital conversion circuits in a time-interleaved manner; and performing gain correction processing and skew correction processing with respect to the analog-to-digital conversion circuit, on the basis of a mixed signal, the mixed signal being obtained by mixing an output signal from the analog-to-digital conversion circuit with a signal made by shifting a phase of the output signal by $\pi/2$.

16 Claims, 8 Drawing Sheets

(56) References Cited

U.S. PATENT DOCUMENTS

| | | | |
|---|---|---|---|
| 2013/0069812 A1* | 3/2013 | Waltari | H03M 1/0626 |
| | | | 341/166 |
| 2013/0076544 A1 | 3/2013 | Waki et al. | |
| 2013/0241753 A1 | 9/2013 | Nozaki | |
| 2014/0010103 A1* | 1/2014 | Haque | H03M 1/1215 |
| | | | 370/252 |
| 2015/0341044 A1* | 11/2015 | Nakamura | H03M 1/0624 |
| | | | 341/118 |

OTHER PUBLICATIONS

Shafiq M. Jamal et al., "A 10-b 120-Msample/s Time-Interleaved Analog-to-Digital Converter With Digital Background Calibration," IEEE Journal of Solid-State Circuits, vol. 37, No. 12, Dec. 2002.JP.

* cited by examiner

ANALOG-TO-DIGITAL CONVERTER AND SEMICONDUCTOR INTEGRATED CIRCUIT

CROSS-REFERENCE TO RELATED APPLICATION

This application is based upon and claims the benefit of priority of the prior Japanese Patent Application No. 2014-194061, filed on Sep. 24, 2014, the entire contents of which are incorporated herein by reference.

FIELD

The embodiments discussed herein are directed to an analog-to-digital converter and a semiconductor integrated circuit.

BACKGROUND

A time-interleaved analog-to-digital converter (ADC) is an ADC that includes a plurality of analog-to-digital conversion circuits (AD conversion circuits), and the plurality of AD conversion circuits sequentially convert an analog input signal into a digital output signal in a time division manner and can realize high-speed operation. However, the time-interleaved ADC sometimes deteriorates in AD conversion accuracy due to a gain mismatch (difference in amplitude in each AD conversion circuit) or a skew (deviation in timing interval when each AD conversion circuit operates) between the AD conversion circuits.

As a method of correcting an error between the plurality of AD conversion circuits in the time-interleaved ADC, various methods are proposed (see, for example, Patent Documents 1 to 3, and Non-Patent Document 1). Further, there are foreground correction of performing correction processing on the error outside the normal operating time of the ADC and background correction of performing correction processing on the error during the normal operation of the ADC. In the background correction, a detection operation and a correction operation for the error can be performed without hindering a normal AD conversion operation.

Figure 8:
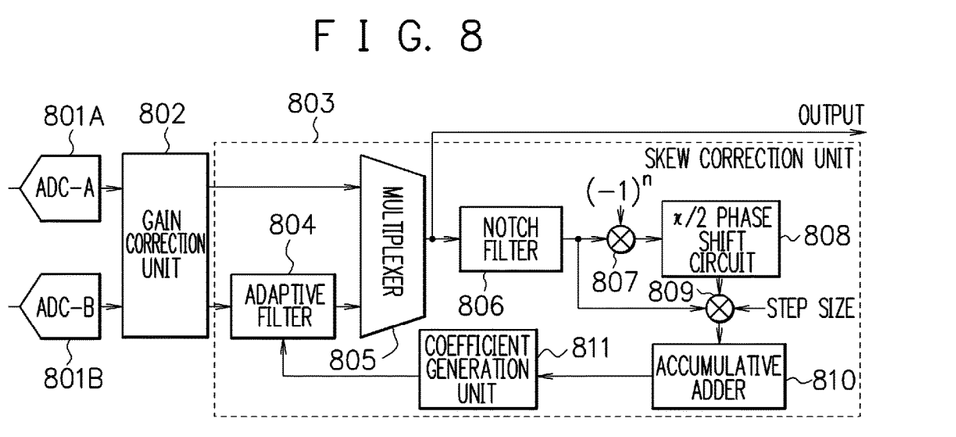
FIG. 8 is a diagram illustrating a configuration example of a conventional analog-to-digital converter.

FIG. 8 is a diagram illustrating a configuration example of a conventional time-interleaved ADC including a gain correction function and a skew correction function. The time-interleaved ADC includes a plurality of AD conversion circuits 801A, 801B. Assuming that the input signal into the time-interleaved ADC is $\cos(\omega_{in}nT+\theta)$, an output signal y(n) from each of the AD conversion circuits 801A, 801B is expressed by the following Expression (1). When the gain of the AD conversion circuit 801A is $G_1$ and the gain of the AD conversion circuit 801B is $G_2$ in the Expression (1), $G=(G_1+G_2)/2$, $\Delta G=G_1-G_2$. Further, $\omega_{in}$ is an input angular frequency, $\omega_s$ is an operating angular frequency (sampling angular frequency) of the time-interleaved ADC, and T is an operation cycle of the time-interleaved ADC. Further, $\theta$ is an initial phase and n is an integer equal to or larger than 0.

[Math. 1]

$$y(n) = \left[G + (-1)^n \frac{\Delta G}{2}\right] \cos(\omega_{in}nT + \theta) \quad (1)$$

$$= \left[G + \frac{\Delta G}{2}\cos\left(\frac{\omega_s nT}{2}\right)\right]\cos(\omega_{in}nT + \theta)$$

$$= \underbrace{G\cos(\omega_{in}nT + \theta)}_{\text{input component}} + \underbrace{\frac{\Delta G}{2}\cos\left\{\left(\omega_{in} - \frac{\omega_s}{2}\right)nT + \theta\right\}}_{\text{image component}}$$

Figure 9:
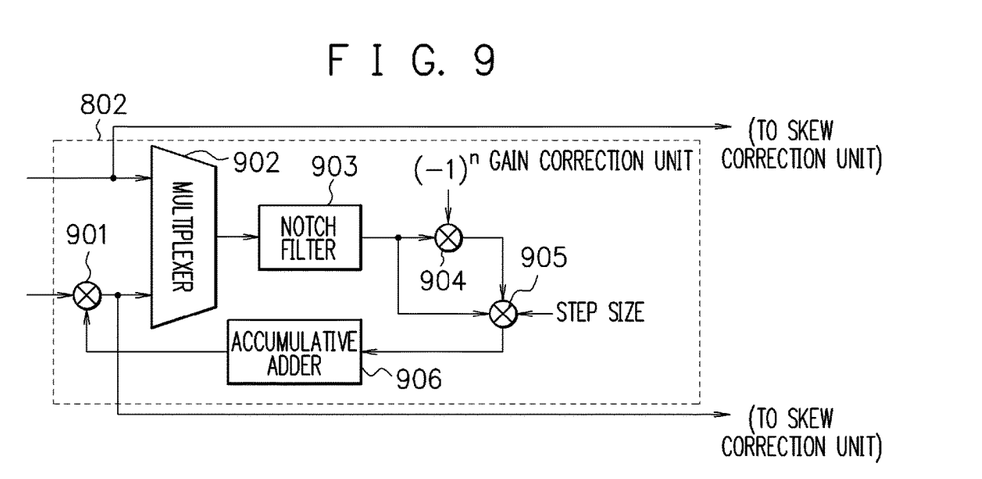
FIG. 9 is a diagram illustrating a configuration example of a gain correction unit of the conventional analog-to-digital converter.

By multiplying the output signal y(n) by $(-1)^n$ by a multiplier 904 of a gain correction unit 802 illustrated in FIG. 9, a signal $y_c(n)$ expressed by the following Expression (2) is obtained. Multiplying the output signal y(n) by $(-1)^n$ corresponds to frequency shift of a sampling frequency fs/2 (fs=$\omega_s/2\pi$).

[Math. 2]

$$y_c(n) = (-1)^n \cdot y(n) \quad (2)$$

$$= \cos\left(\frac{\omega_s nT}{2}\right)\left\{G\cos(\omega_{in}nT+\theta) + \frac{\Delta G}{2}\cos\left[\left(\omega_{in}-\frac{\omega_s}{2}\right)nT+\theta\right]\right\}$$

$$= G\cos\left[\left(\omega_{in}-\frac{\omega_s}{2}\right)nT+\theta\right] + \frac{\Delta G}{2}\cos(\omega_{in}nT+\theta)$$

Then, by multiplying the output signal y(n) by the signal $y_c(n)$ by a multiplier 905 of the gain correction unit 802, an output expressed by the following Expression (3) is obtained.

[Math. 3]

$$y(n) \cdot y_c(n) = \left\{G\cos(\omega_{in}nT+\theta) + \frac{\Delta G}{2}\cos\left[\left(\omega_{in}-\frac{\omega_s}{2}\right)nT+\theta\right]\right\} \times \quad (3)$$

$$\left\{G\cos\left[\left(\omega_{in}-\frac{\omega_s}{2}\right)nT+\theta\right] + \frac{\Delta G}{2}\cos(\omega_{in}nT+\theta)\right\} =$$

$$\frac{G^2}{2}\left\{\cos\left[\left(2\omega_{in}-\frac{\omega_s}{2}\right)nT+2\theta\right] + \cos\left(\frac{\omega_s nT}{2}\right)\right\} + \frac{G \cdot \Delta G}{4}$$

$$\{\cos[(2\omega_{in}-\omega_s)nT+2\theta]+1\} + \frac{G \cdot \Delta G}{4}\{\cos(2\omega_{in}nT+2\theta)+1\} +$$

$$\frac{1}{2}\left(\frac{\Delta G}{2}\right)^2\left\{\cos\left[\left(2\omega_{in}-\frac{\omega_s}{2}\right)nT+2\theta\right] + \cos\left(\frac{\omega_s nT}{2}\right)\right\}$$

In the case where the angular frequency $\omega_{in}$ of the input signal is not ¼ of the operating angular frequency $\omega_s$ of the time-interleaved ADC, terms of the trigonometric function, when averaged, can be recognized to be 0 in Expression (3). Therefore, an output from an accumulative adder 906 of the gain correction unit 802 that accumulatively adds the output $y(n) \cdot y_c(n)$ from the multiplier 905 becomes as expressed in the following Expression (4). Using a detection value for gain correction, a multiplier 901 of the gain correction unit 802 performs gain correction.

[Math. 4]

$$\overline{y(n) \cdot y_c(n)} = \frac{G \cdot \Delta G}{4} + \frac{G \cdot \Delta G}{4} = \frac{G \cdot \Delta G}{2} \quad (4)$$

On the other hand, in the case where the angular frequency $\omega_{in}$ of the input signal is ¼ of the operating angular frequency $\omega_s$ of the time-interleaved ADC, when $\omega_{in}=\omega_s/4$ is substituted into Expression (3), the output $y(n) \cdot y_c(n)$ from the multiplier 905 becomes as expressed in the following Expression (5).

[Math. 5]

$$y(n) \cdot y_c(n) = \qquad (5)$$
$$\frac{G^2}{2}\left\{\cos 2\theta + \cos\left(\frac{\omega_s nT}{2}\right)\right\} + \frac{G \cdot \Delta G}{4}\left\{\cos\left(-\frac{\omega_s nT}{2} + 2\theta\right) + 1\right\} +$$
$$\frac{G \cdot \Delta G}{4}\left\{\cos\left(\frac{\omega_s nT}{2} + 2\theta\right) + 1\right\} + \frac{1}{2}\left(\frac{\Delta G}{2}\right)^2\left\{\cos(2\theta) + \cos\left(\frac{\omega_s nT}{2}\right)\right\}$$

Through averaging by the accumulative adder 906, the detection value for gain correction becomes different from that in Expression (4) as illustrated in the following Expression (6).

[Math. 6]

$$\overline{y(n) \cdot y_c(n)} = \frac{G^2}{2}\cos 2\theta + \frac{G \cdot \Delta G}{2} + \frac{1}{2}\left(\frac{\Delta G}{2}\right)^2\cos 2\theta \qquad (6)$$

Figure 10:
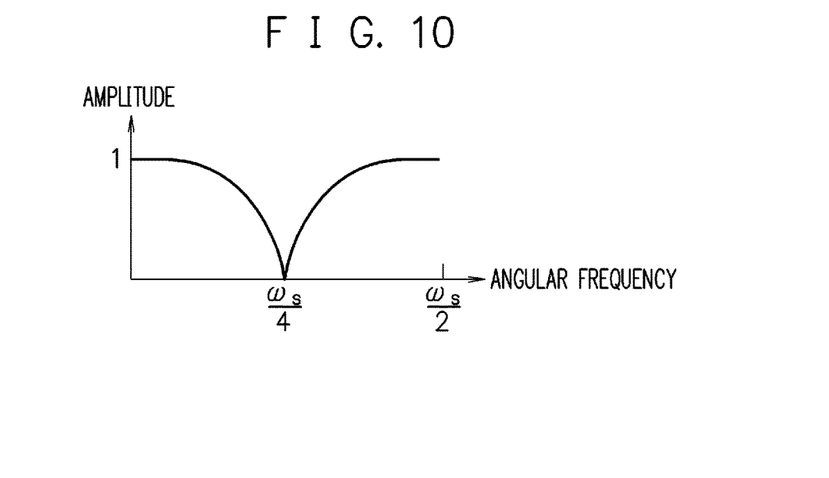
FIG. 10 is a chart illustrating a frequency characteristic of a notch filter.

If the multiplier 901 of the gain correction unit 802 performs gain correction using the detection value for gain correction, accurate error correction is not performed. Hence, a notch filter 903 that has a frequency characteristic as illustrated in FIG. 10 to reduce a component of $\omega_s/4$ is conventionally provided at a stage subsequent to the multiplexer 902 that selects and outputs the output relating to the AD conversion circuit 801A, 801B as illustrated in FIG. 9, so as not to perform the correction when the angular frequency $\omega_{in}$ of the input signal is $\omega_s/4$.

Assuming that the input signal into the time-interleaved ADC is $\cos(\omega_{in}nT+\theta)$, the output signal y(n) from each of the AD conversion circuits 801A, 801B containing the skew (deviation in time) is expressed by the following Expression (7). When the gain of the AD conversion circuit 801A is $G_1$ and the gain of the AD conversion circuit 801B is $G_2$ in the Expression (7), $G=(G_1+G_2)/2$. Further, $\omega_{in}$ is an input angular frequency, $\omega_s$ is an operating angular frequency (sampling angular frequency) of the time-interleaved ADC, and T is an operation cycle of the time-interleaved ADC. Further, $\Delta t$ is a skew (deviation in time), $\theta$ is an initial phase, and n is an integer equal to or larger than 0. The following Expression (7) is expanded utilizing $\cos((\omega_{in}\Delta t)/2)\approx(\omega_{in}\Delta t)/2$, $\sin((\omega_{in}\Delta t)/2)\approx 1$ when $\Delta t \ll 1$.

[Math. 7]

$$y(n) = G\cos(\omega_{in}nT + \theta)|_{t=nT+\Delta t/2-(-1)^n(\Delta t/2)} \qquad (7)$$
$$= G\cos\left(\frac{\omega_{in}\Delta t}{2}\right)\cos\left(\omega_{in}nT + \frac{\omega_{in}\Delta t}{2} + \theta\right) +$$
$$G\sin\left(\frac{\omega_{in}\Delta t}{2}\right)\sin\left\{\left(\omega_{in} - \frac{\omega_s}{2}\right)nT + \frac{\omega_{in}\Delta t}{2} + \theta\right\}$$
$$\cong \underbrace{\frac{G\omega_{in}\Delta t}{2}\cos\left(\omega_{in}nT + \frac{\omega_{in}\Delta t}{2} + \theta\right)}_{input\ component} +$$
$$\underbrace{G\sin\left\{\left(\omega_{in} - \frac{\omega_s}{2}\right)nT + \frac{\omega_{in}\Delta t}{2} + \theta\right\}}_{image\ component}$$

By multiplying the output signal y(n) by $(-1)^n$ by a multiplier 807 of the skew correction unit 803, a signal $y_c(n)$ expressed by the following Expression (8) is obtained.

[Math. 8]

$$y_c(n) = (-1)^n y(n) \qquad (8)$$
$$= \cos\left(\frac{\omega_s nT}{2}\right)\left[\frac{G\omega_{in}\Delta t}{2}\cos\left(\omega_{in}nT + \frac{\omega_{in}\Delta t}{2} + \theta\right) + G\sin\left\{\left(\omega_{in} - \frac{\omega_s}{2}\right)nT + \frac{\omega_{in}\Delta t}{2} + \theta\right\}\right]$$
$$= \frac{G\omega_{in}\Delta t}{2}\cos\left[\left(\frac{\omega_s}{2} - \omega_{in}\right)nT - \frac{\omega_{in}\Delta t}{2} - \theta\right] +$$
$$G\sin\left(\omega_{in}nT + \frac{\omega_{in}\Delta t}{2} + \theta\right)$$

Further, by shifting the signal $y_c(n)$ outputted from the multiplier 807 by $\pi/2$ by a phase shift circuit 808, a signal $y_d(n)$ expressed by the following Expression (9) is obtained.

[Math. 9]

$$y_d(n) = \frac{G\omega_{in}\Delta t}{2}\cos\left[\left(\frac{\omega_s}{2} - \omega_{in}\right)nT - \frac{\omega_{in}\Delta t}{2} - \theta - \frac{\pi}{2}\right] + \qquad (9)$$
$$G\sin\left(\omega_{in}nT + \frac{\omega_{in}\Delta t}{2} + \theta - \frac{\pi}{2}\right)$$
$$= \frac{G\omega_{in}\Delta t}{2}\sin\left[\left(\frac{\omega_s}{2} - \omega_{in}\right)nT - \frac{\omega_{in}\Delta t}{2} - \theta\right] -$$
$$G\cos\left(\omega_{in}nT + \frac{\omega_{in}\Delta t}{2} + \theta\right)$$

Then, by multiplying the output signal y(n) by the signal $y_d(n)$ by a multiplier 809, an output expressed by the following Expression (10) is obtained.

[Math. 10]

$$y(n) \cdot y_d(n) = \left\{\frac{G\omega_{in}\Delta t}{2}\cos\left[\omega_{in}nT - \frac{\omega_{in}\Delta t}{2} - \theta\right] + \qquad (10)\right.$$
$$\left.G\sin\left[\left(\omega_{in} - \frac{\omega_s}{2}\right)nT + \frac{\omega_{in}\Delta t}{2} + \theta\right]\right\} \times$$
$$\left\{\frac{G\omega_{in}\Delta t}{2}\sin\left[\left(\frac{\omega_s}{2} - \omega_{in}\right)nT - \frac{\omega_{in}\Delta t}{2} - \theta\right] - \right.$$
$$\left.G\cos\left(\omega_{in}nT + \frac{\omega_{in}\Delta t}{2} + \theta\right)\right\} =$$
$$\frac{1}{2}\left(\frac{G\omega_{in}\Delta t}{2}\right)^2\left\{\sin\left(\frac{\omega_s nT}{2}\right) - \sin\left[(2\omega_{in} - \frac{\omega_s}{2})nT + \omega_{in}\Delta t + 2\theta\right]\right\} -$$
$$\frac{G^2\omega_{in}\Delta t}{4}\{1 - \cos[(2\omega_{in} - \omega_s)nT + \omega_{in}\Delta t + 2\theta]\} -$$
$$\frac{G^2\omega_{in}\Delta t}{4}\{\cos(2\omega_{in}nT + \omega_{in}\Delta t + 2\theta) + 1\} -$$
$$\frac{G^2}{2}\left\{\sin\left[(2\omega_{in} - \frac{\omega_s}{2})nT + \omega_{in}\Delta t + 2\theta\right] + \sin\left(-\frac{\omega_s nT}{2}\right)\right\}$$

In the case where the angular frequency $\omega_{in}$ of the input signal is not ¼ of the operating angular frequency $\omega_s$ of the time-interleaved ADC, terms of the trigonometric function, when averaged, can be recognized to be 0 in Expression (10). Therefore, an output from an accumulative adder 810 that accumulatively adds the output $y(n)\cdot y_d(n)$ from the multiplier 809 becomes as expressed in the following Expression (11). Using a detection value for skew correction, a coefficient generation unit 811 of the skew correction unit 803 generates a coefficient value using a detection value for skew correction and sets it in an adaptive filter 804 to thereby perform skew correction.

[Math. 11]

$$\overline{y(n) \cdot y_d(n)} = -\frac{G^2 \cdot \omega_{in} \cdot \Delta t}{4} - \frac{G^2 \cdot \omega_{in} \cdot \Delta t}{4} = -\frac{G^2 \cdot \omega_{in} \cdot \Delta t}{2} \quad (11)$$

On the other hand, in the case where the angular frequency $\omega_{in}$ of the input signal is ¼ of the operating angular frequency $\omega_s$ of the time-interleaved ADC, when $\omega_{in}=\omega_s/4$ is substituted into Expression (10), the output $y(n)\cdot y_d(n)$ from the multiplier 809 becomes as expressed in the following Expression (12).

[Math. 12]

$$y(n) \cdot y_d(n) = \frac{1}{2}\left(\frac{G\omega_s \Delta t}{8}\right)^2 \left\{\sin\left(\frac{\omega_s nT}{2}\right) - \sin\left(\frac{\omega_s \Delta t}{4} + 2\theta\right)\right\} - \\ \frac{G^2 \omega_s \Delta t}{16}\left\{1 - \cos\left(-\frac{\omega_s nT}{2} + \frac{\omega_s \Delta t}{4} + 2\theta\right)\right\} - \\ \frac{G^2 \omega_s \Delta t}{16}\left\{\cos\left(\frac{\omega_s nT}{2} + \frac{\omega_s \Delta t}{4} + 2\theta\right) + 1\right\} - \\ \frac{G^2}{2}\left\{\sin\left(\frac{\omega_s \Delta t}{4} + 2\theta\right) + \sin\left(-\frac{\omega_s nT}{2}\right)\right\} \quad (12)$$

Through averaging by the accumulative adder 810, the detection value for skew correction becomes different from that in Expression (11) as illustrated in the following Expression (13).

[Math. 13]

$$\overline{y(n) \cdot y_d(n)} = \\ -\frac{1}{2}\left(\frac{G\omega_s \Delta t}{8}\right)^2 \sin\left(\frac{\omega_s \Delta t}{4} + 2\theta\right) - \frac{G^2 \omega_s \Delta t}{8} - \frac{G^2}{2}\sin\left(\frac{\omega_s \Delta t}{4} + 2\theta\right) \quad (13)$$

If the coefficient generation unit 811 of the skew correction unit 803 generates the coefficient value using the detection value for skew correction and sets it in the adaptive filter 804 to thereby perform skew correction, accurate error correction is not performed. Hence, a notch filter 806 that has a frequency characteristic as illustrated in FIG. 10 to reduce a component of $\omega_s/4$ is conventionally provided at a stage subsequent to the multiplexer 805 that selects and outputs the output relating to the AD conversion circuit 801A, 801B as illustrated in FIG. 8, so as not to perform the skew correction when the angular frequency $\omega_{in}$ of the input signal is $\omega_s/4$.

[Patent Document 1] Japanese Laid-open Patent Publication No. 2013-191956
[Patent Document 2] Japanese Laid-open Patent Publication No. 2013-74308
[Patent Document 3] Japanese Laid-open Patent Publication No. 2013-31055
[Non-Patent Document 1] S. M. Jamal et al., "Calibration of Sample-Time Error in a Two-Channel Time-Interleaved Analog-to-Digital Converter," IEEE Trans. Circuits Syst. I, vol. 51, pp. 130-139, Jan. 2004

Figure 11A:
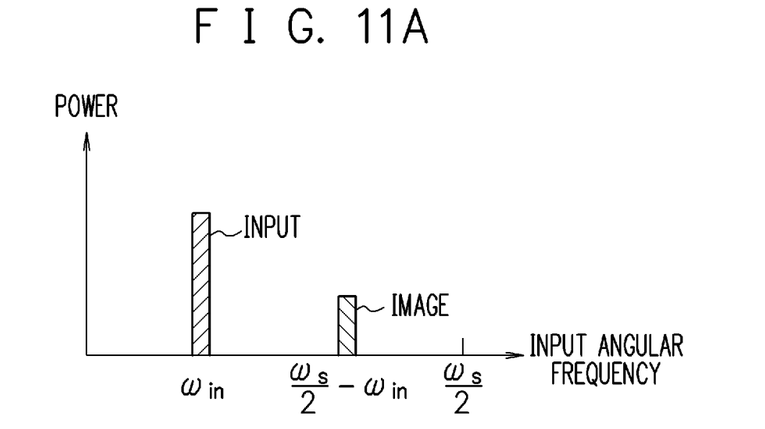
FIG. 11A and FIG. 11B are charts each illustrating an input component and an image component.
Figure 11B:
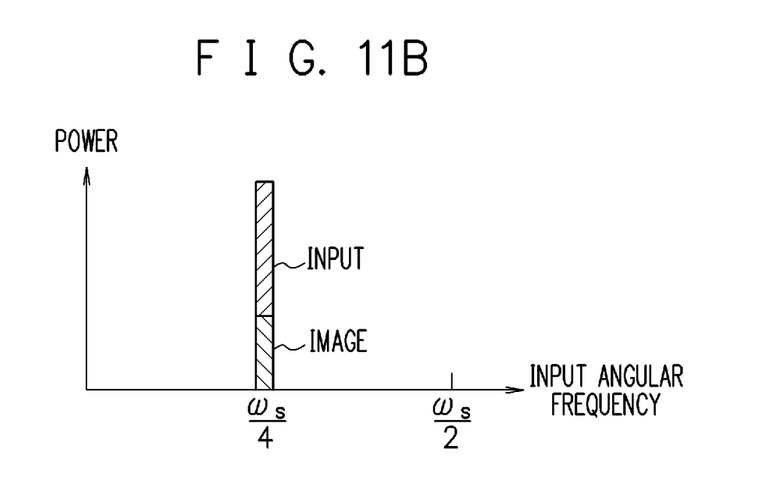

In the above-described conventional time-interleaved ADC, in the case where the angular frequency $\omega_{in}$ of the input signal is ¼ of the operating angular frequency $\omega_s$ of the time-interleaved ADC, the gain correction and the skew correction is not accurately performed. This is because when $\omega_{in}^* \neq \omega_s/4$, a component INPUT of the input signal and a component (image signal component) IMAGE of the error signal in the digital output signal become different frequency components as illustrated in FIG. 11A, whereas when $\omega_{in}=\omega_s/4$ the component INPUT of the input signal and the component (image signal component) IMAGE of the error signal in the digital output signal become the same frequency components as illustrated in FIG. 11B and is not distinguished from each other.

SUMMARY

An aspect of an analog-to-digital converter includes: a plurality of analog-to-digital conversion circuits configured to convert an analog input signal into a digital output signal in a time-interleaved manner; and a correction circuit configured to perform at least one of gain correction processing and skew correction processing with respect to the analog-to-digital conversion circuit. The correction circuit performs the correction processing on the basis of a mixed signal, the mixed signal being obtained by mixing an output signal from the analog-to-digital conversion circuit with a signal made by shifting a phase of the output signal by $\pi/2$.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, there will be described embodiments based on the drawings.

First Embodiment

Figure 1:
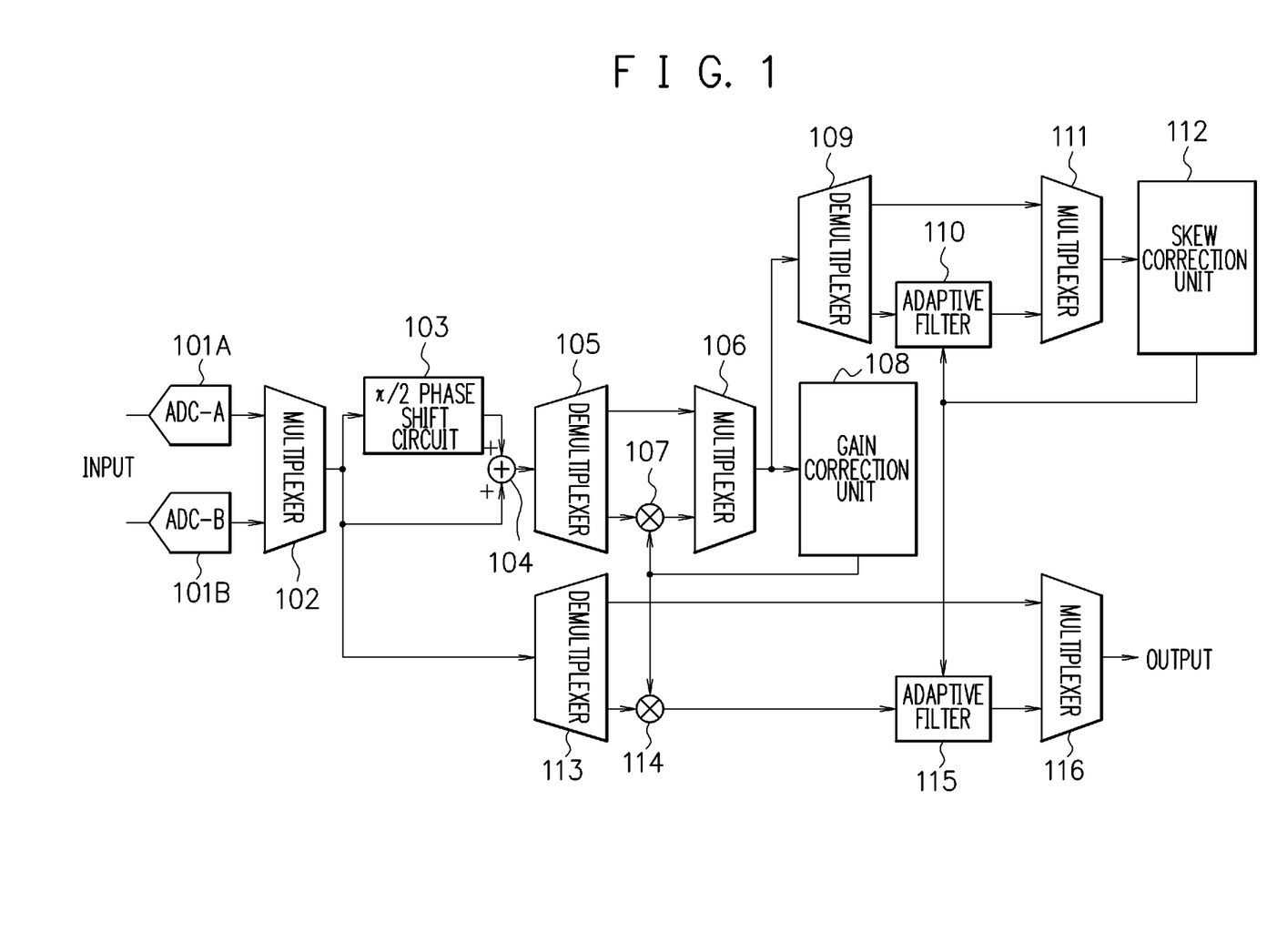
FIG. 1 is a diagram illustrating a configuration example of an analog-to-digital converter according to a first embodiment.

A first embodiment will be described.
FIG. 1 is a diagram illustrating a configuration example of a time-interleaved analog-to-digital converter (ADC)

according to the first embodiment. The time-interleaved ADC includes a plurality of (two in this example) AD conversion circuits 101A, 101B that convert an analog input signal to a digital output signal in a time-interleaved manner. FIG. 1 illustrates an example of performing gain correction and skew correction for the AD conversion circuit 101B on the basis of the AD conversion circuit 101A.

The analog input signal is inputted into each of the AD conversion circuits 101A, 101B, and sampled at a sampling frequency fs (angular frequency $\omega_s=2\pi fs$) alternately by the AD conversion circuits 101A, 101B and converted into the digital output signal. In other words, the AD conversion circuits 101A, 101B sample the analog input signal at timings shifted from each other by a cycle of the sampling frequency fs and in a cycle of two times the sampling frequency fs, and convert the analog input signal into the digital output signal in a time-interleaved manner.

The output signals from the AD conversion circuits 101A, 101B are selectively outputted by a multiplexer 102. Multiplexers 102, 106, 111, 116 and demultiplexers 105, 109, 113 included in the time-interleaved ADC illustrated in FIG. 1 operate in synchronization with the sampling timings of the time-interleaved ADC, in other words, the AD conversion circuits 101A, 101B.

For example, the multiplexer 102 selects and outputs the output signal from the AD conversion circuit 101A in a period in which the output signal from the AD conversion circuit 101A is enabled, and selects and outputs the output signal from the AD conversion circuit 101B in a period in which the output signal from the AD conversion circuit 101B is enabled, according to the sampling timings. Further, for example, the multiplexer 102 outputs an output from the multiplexer 102 to one output (an output line corresponding to the AD conversion circuit 101A) in the period in which the output signal from the AD conversion circuit 101A is enabled, and outputs the output from the multiplexer 102 to another output (an output line corresponding to the AD conversion circuit 101B) in the period in which the output signal from the AD conversion circuit 101B is enabled, according to the sampling timings.

A $\pi/2$ phase shift circuit 103 shifts the phase of the output from the multiplexer 102 (the output from the AD conversion circuit 101A, 101B) by $\pi/2$. An adder 104 adds the output from the multiplexer 102 and an output from the $\pi/2$ phase shift circuit 103. In other words, the adder 104 generates a signal in which the output signal from the AD conversion circuit 101A, 101B is mixed with a signal made by shifting the phase of the output signal from the AD conversion circuit 101A, 101B by $\pi/2$.

The demultiplexer 105 outputs an output from the adder 104 to any one of a plurality of outputs. The demultiplexer 105 supplies the output from the adder 104 to the multiplexer 106 through one of the outputs in the period in which the output signal from the AD conversion circuit 101A is enabled, and supplies the output from the adder 104 to the multiplexer 106 through the other of the outputs via a multiplier 107 in the period in which the output signal from the AD conversion circuit 101B is enabled.

The multiplexer 106 outputs the output from the adder 104 supplied from the demultiplexer 105 to a gain correction unit 108 and the demultiplexer 109. The multiplexer 106 selects and outputs the one of the outputs from the demultiplexer 105 in the period in which the output signal from the AD conversion circuit 101A is enabled, and selects and outputs the other of the outputs from the demultiplexer 105 supplied thereto via the multiplier 107 in the period in which the output signal from the AD conversion circuit 101B is enabled.

Figure 2:
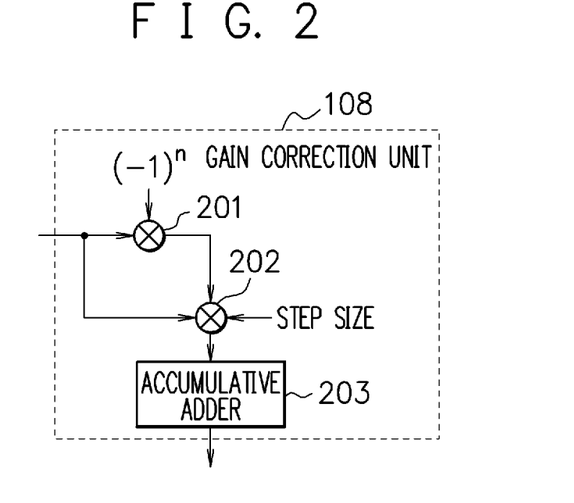
FIG. 2 is a diagram illustrating a configuration example of a gain correction unit in the first embodiment.

The gain correction unit 108 detects a gain correction value according to the magnitude of a gain mismatch between the AD conversion circuits 101A and 101B included in the time-interleaved ADC on the basis of an output from the multiplexer 106, and controls error correction processing (gain correction processing). The gain correction unit 108 includes multipliers 201, 202 and an accumulative adder 203 as illustrated in FIG. 2.

The multiplier 201 multiplies the output from the multiplexer 106 by a signal $(-1)^n$ that is inverted to +1, −1 every sampling timing n. Namely, an output from the multiplier 201 becomes an output corresponding to the above-described Expression (2). Multiplying the output from the multiplexer 106 by $(-1)^n$ corresponds to frequency shift of the sampling frequency fs/2 ($fs=\omega_s/2\pi$). Thus, an input signal component of the angular frequency $\omega_{in}$ is shifted to an angular frequency $(\omega_s/2)-\omega_{in}$, and an error signal component (image signal component) of the angular frequency $(\omega_s/2)-\omega_{in}$ is shifted to the angular frequency $\omega_{in}$.

The multiplier 202 multiplies the output from the multiplexer 106 by an output from the multiplier 201. Namely, an output from the multiplier 202 becomes an output corresponding to the above-described Expression (3). A step size to be inputted into the multiplier 202 is for controlling the speed of feedback control so that convergence becomes faster with a larger step size, whereas it becomes slower with a smaller step size.

The accumulative adder 203 accumulatively adds the output from the multiplier 202 and finds an average of the gain error between the AD conversion circuits 101A and 101B. By controlling the multipliers 107, 114 according to the gain correction value detected by the accumulative adder 203, processing for correcting the gain error is performed on the output from the AD conversion circuit 101B, whereby the gain correction between the AD conversion circuits 101A and 101B is performed.

The demultiplexer 109 outputs the output from the multiplexer 106 to any one of a plurality of outputs. The demultiplexer 109 supplies the output from the multiplexer 106 to the multiplexer 111 through one of the outputs in the period in which the output signal from the AD conversion circuit 101A is enabled, and supplies the output from the multiplexer 106 to the multiplexer 111 through the other of the outputs via an adaptive filter 110 in the period in which the output signal from the AD conversion circuit 101B is enabled.

The multiplexer 111 outputs the output from the multiplexer 106 supplied from the demultiplexer 109 to a skew correction unit 112. The multiplexer 111 selects and outputs the one of the outputs from the demultiplexer 109 in the period in which the output signal from the AD conversion circuit 101A is enabled, and selects and outputs the other of the outputs from the demultiplexer 109 supplied thereto via the adaptive filter 110 in the period in which the output signal from the AD conversion circuit 101B is enabled.

Figure 3:
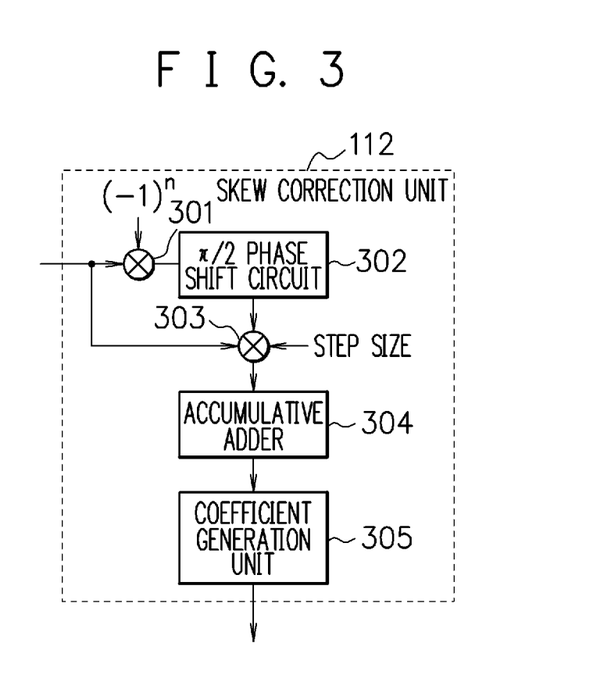
FIG. 3 is a diagram illustrating a configuration example of a skew correction unit in the first embodiment.

The skew correction unit 112 detects a skew correction value according to the magnitude of a skew (deviation in time, in other words, deviation in sampling timing) between the AD conversion circuits 101A and 101B included in the time-interleaved ADC on the basis of an output from the multiplexer 111, and controls error correction processing (skew correction processing). The skew correction unit 112 includes multipliers 301, 303, a $\pi/2$ phase shift circuit 302, and an accumulative adder 304, and a coefficient generation unit 305 as illustrated in FIG. 3.

The multiplier 301 multiplies the output from the multiplexer 111 by a signal $(-1)^n$ that is inverted to +1, −1 every sampling timing n. Namely, an output from the multiplier 301 becomes an output corresponding to the above-described Expression (8). Multiplying the output from the multiplexer 111 by $(-1)^n$ corresponds to frequency shift of the sampling frequency fs/2 (fs=$\omega_s/2\pi$). Thus, the input signal component of the angular frequency $\omega_{in}$ is shifted to the angular frequency $(\omega_s/2)-\omega_{in}$, and the error signal component (image signal component) of the angular frequency $(\omega_s/2)-\omega_{in}$ is shifted to the angular frequency $\omega_{in}$. The $\pi/2$ phase shift circuit 302 shifts the phase of the output from the multiplier 301 by $\pi/2$. Namely, an output from the $\pi/2$ phase shift circuit 302 becomes an output corresponding to the above-described Expression (9).

The multiplier 303 multiplies the output from the multiplexer 111 by the output from the $\pi/2$ phase shift circuit 302. Namely, an output from the multiplier 303 becomes an output corresponding to the above-described Expression (10). A step size to be inputted into the multiplier 303 is the same as the step size inputted into the multiplier 202 in the gain correction unit 108 illustrated in FIG. 2.

The accumulative adder 304 accumulatively adds the output from the multiplier 303 and finds an average of a skew error between the AD conversion circuits 101A and 101B. The coefficient generation unit 305 generates a coefficient to be set in the adaptive filters 110, 115 according to a skew correction value detected by the accumulative adder 304. By setting the coefficient according to the skew correction value in the adaptive filters 110, 115 in this manner, phase shift (phase adjustment) whether to proceed or delay the phase is performed on the output from the AD conversion circuit 101B, whereby the skew correction between the AD conversion circuits 101A and 101B is performed.

The demultiplexer 113 outputs the output from the multiplexer 102 (the output from the AD conversion circuit 101A, 101B) to any one of a plurality of outputs. The demultiplexer 113 supplies the output from the multiplexer 102 to the multiplexer 116 through one of the outputs in the period in which the output signal from the AD conversion circuit 101A is enabled, and supplies the output from the multiplexer 102 to the multiplexer 116 through the other of the outputs via the multiplier 114 and the adaptive filter 115 in the period in which the output signal from the AD conversion circuit 101B is enabled.

The multiplier 114 performs gain correction on the output from the multiplexer 102, namely, the output signal from the AD conversion circuit 101B according to the control by the gain correction unit 108. The adaptive filter 115 performs skew correction on the output from the multiplexer 102, namely, the output signal from the AD conversion circuit 101B according to the control by the skew correction unit 112.

The multiplexer 116 outputs the output from the multiplexer 102 supplied from the demultiplexer 113 as a digital output signal. The multiplexer 116 selects and outputs one of outputs from the demultiplexer 113, namely, the output signal from the AD conversion circuit 101A in the period in which the output signal from the AD conversion circuit 101A is enabled. Further, the multiplexer 116 selects and outputs the other of the outputs that has been subjected to the gain correction and the skew correction by the multiplier 114 and the adaptive filter 115, namely, the output signal from the AD conversion circuit 101B in the period in which the output signal from the AD conversion circuit 101B is enabled.

In the time-interleaved ADC in this embodiment, the $\pi/2$ phase shift circuit 103 and the adder 104 generate the signal in which the output signal from the AD conversion circuit 101A, 101B is mixed with the signal made by shifting the phase of the output signal from the AD conversion circuit 101A, 101B by $\pi/2$, and the gain correction processing and the skew correction processing between the AD conversion circuits 101A and 101B are performed using the signal obtained by the mixing.

As described above, when the angular frequency $\omega_{in}$ of the input signal is ¼ of the operating angular frequency $\omega_s$ of the time-interleaved ADC, the gain correction value and the skew correction value detected based on the output signals from the AD conversion circuits 101A, 101B are expressed by the following Expression (14) and Expression (15).

[Math. 14]

$$\frac{G \cdot \Delta G}{2} + \frac{G^2}{2}\cos 2\theta + \frac{1}{2}\left(\frac{\Delta G}{2}\right)^2 \cos 2\theta \quad (14)$$

$$-\frac{G^2 \cdot \omega_s \cdot \Delta t}{8} - \frac{G^2}{2}\sin\left(\frac{\omega_s \cdot \Delta t}{4} + 2\theta\right) - \frac{1}{2}\left(\frac{G \cdot \omega_s \cdot \Delta t}{8}\right)^2 \sin\left(\frac{\omega_s \cdot \Delta t}{4} + 2\theta\right) \quad (15)$$

In this embodiment, by using a signal made by shifting the phase of the output signal from the AD conversion circuit 101A, 101B by $\pi/2$ (a signal made by changing $\theta$ to $\theta+\pi/2$), a gain correction value and a skew correction value, as expressed by the following Expression (16) and Expression (17), having components in a reverse phase to the Expression (14) and Expression (15), are detected.

[Math. 15]

$$\frac{G^2 \cdot \Delta G}{2} - \frac{G^2}{2}\cos 2\theta - \frac{1}{2}\left(\frac{\Delta G}{2}\right)^2 \cos 2\theta \quad (16)$$

$$-\frac{G^2 \cdot \omega_s \cdot \Delta t}{8} + \frac{G^2}{2}\sin\left(\frac{\omega_s \cdot \Delta t}{4} + 2\theta\right) + \frac{1}{2}\left(\frac{G \cdot \omega_s \cdot \Delta t}{8}\right)^2 \sin\left(\frac{\omega_s \cdot \Delta t}{4} + 2\theta\right) \quad (17)$$

As described above, using the signal in which the output signal from the AD conversion circuit 101A, 101B is mixed with the signal made by shifting the phase of the output signal from the AD conversion circuit 101A, 101B by $\pi/2$, makes it possible to accurately obtain the gain correction value and the skew correction value even when the angular frequency $\omega_{in}$ of the input signal is ¼ of the operating angular frequency $\omega_s$ of the time-interleaved ADC as is clear from Expression (14) to Expression (17). The difference between Expression (14) and Expression (15) becomes $(G \cdot \Delta G)$, the difference between Expression (16) and Expression (17) becomes $-(G^2 \cdot \omega_s \cdot \Delta t)/4$, and the gain correction value proportional to the magnitude of the gain mismatch $(\Delta G)$ is obtained. Further, the skew correction value corresponding to the magnitude of the skew $(\Delta t)$ is obtained. Therefore, according to this embodiment, it becomes possible to detect the gain error and the skew error at an arbitrary frequency irrespective of the angular frequency $\omega_{in}$ of the input signal and perform the gain correction processing and the skew correction processing between the AD conversion circuits 101A and 101B.

Second Embodiment

Next, a second embodiment will be described.

In the above-described first embodiment, the circuit that generates the signal in which the output signal from the AD conversion circuit included in the time-interleaved ADC is mixed with the signal made by shifting the phase of the output signal by $\pi/2$, is provided for each of the gain correction unit and the skew correction unit and at a stage previous thereto. The configuration illustrated in the first embodiment includes many excess circuits and thus increases in circuit scale. The second embodiment described below is configured such that the circuit that generates the signal in which the output signal from the AD conversion circuit is mixed with the signal made by shifting the phase of the output signal by $\pi/2$, is incorporated in the skew correction unit.

Figure 4:
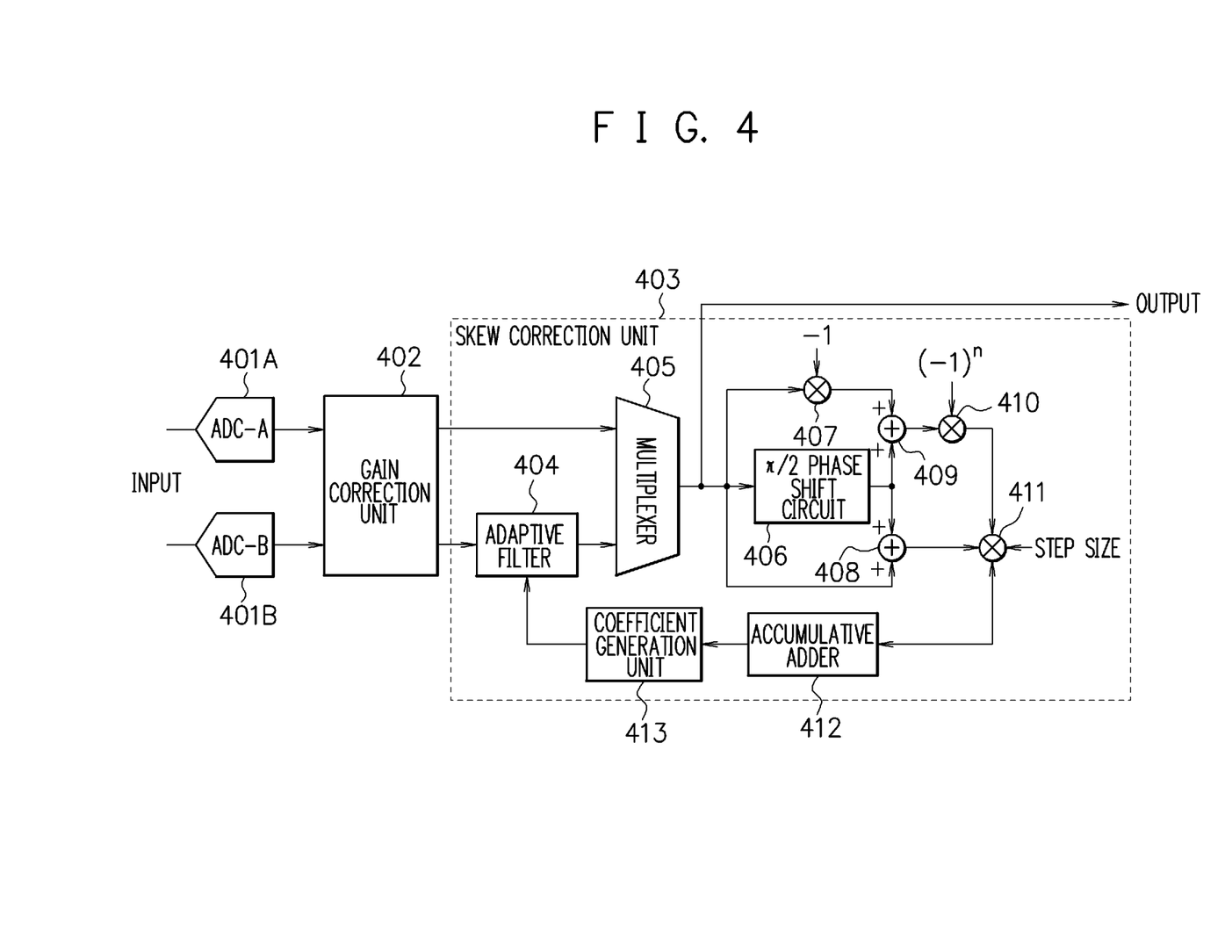
FIG. 4 is a diagram illustrating a configuration example of an analog-to-digital converter according to a second embodiment.

FIG. 4 is a diagram illustrating a configuration example of a time-interleaved ADC according to the second embodiment. The time-interleaved ADC according to the second embodiment includes a plurality of AD conversion circuits 401A, 401B that convert an analog input signal to a digital output signal in a time-interleaved manner. FIG. 4 illustrates an example of performing gain correction and skew correction for an AD conversion circuit 401B on the basis of an AD conversion circuit 401A. The gain correction in the second embodiment is the same as conventionally performed, so that the gain correction is not performed when the angular frequency $\omega_{in}$ of the input signal is ¼ of the operating angular frequency $\omega_s$ of the time-interleaved ADC.

The analog input signal is inputted into each of the AD conversion circuits 401A, 401B as in the first embodiment, and sampled at a sampling frequency fs (angular frequency $\omega_s=2\pi fs$) alternately by the AD conversion circuits 401A, 401B and converted into the digital output signal. The output signals from the AD conversion circuits 401A, 401B are subjected to gain correction processing at a gain correction unit 402 and outputted. The gain correction unit 402 is the same as the gain correction unit 802 illustrated in FIG. 8. The output signals from the AD conversion circuits 401A, 401B that have been subjected to the gain correction processing in the gain correction unit 402 are inputted into a skew correction unit 403.

The skew correction unit 403 includes an adaptive filter 404, a multiplexer 405, a $\pi/2$ phase shift circuit 406, multipliers 407, 410, 411, adders 408, 409, an accumulative adder 412, and a coefficient generation unit 413. As output signals from the gain correction unit 402, the output signal from the AD conversion circuit 401A is inputted as it is into the multiplexer 405, and the output signal from the AD conversion circuit 401B is inputted into the multiplexer 405 via the adaptive filter 404.

The multiplexer 405 outputs the output signal from the AD conversion circuit 401A, 401B from the gain correction unit 402 to the $\pi/2$ phase shift circuit 406, the multiplier 407, and the adder 408, and outputs the output signal as a digital output signal. The multiplexer 405 selects and outputs the output signal from the AD conversion circuit 401A from the gain correction unit 402 in the period in which the output signal from the AD conversion circuit 401A is enabled, and selects and outputs the output signal from the AD conversion circuit 401B from the gain correction unit 402 supplied thereto via the adaptive filter 404 in the period in which the output signal from the AD conversion circuit 401B is enabled.

The $\pi/2$ phase shift circuit 406 shifts the phase of an output from the multiplexer 405 by $\pi/2$. The multiplier 407 multiplies the output from the multiplexer 405 by a signal (−1). Multiplying the output from the multiplexer 405 by a signal (−1) corresponds to phase shift of $(\pi/2)+(\pi/2)=\pi$ (bringing it into a reverse phase).

The adder 408 adds and outputs the output from the multiplexer 405 and an output from the $\pi/2$ phase shift circuit 406. In other words, the adder 408 generates a signal in which the output signal from the AD conversion circuit 401A, 401B is mixed with a signal made by shifting the phase of the output signal from the AD conversion circuit 401A, 401B by $\pi/2$.

The adder 409 adds and outputs the output from the $\pi/2$ phase shift circuit 406 and an output from the multiplier 407. In other words, the adder 409 generates a signal in which the output signal from the AD conversion circuit 401A, 401B whose phase has been shifted by $\pi/2$ is mixed with a signal made by further shifting by $\pi/2$ the phase of the output signal from the AD conversion circuit 401A, 401B whose phase has been shifted by $\pi/2$.

The multiplier 410 multiplies an output from the adder 409 by a signal $(-1)^n$ that is inverted to +1, −1 every sampling timing n. The multiplier 411 multiplies an output from the adder 408 by an output from the multiplier 410. A step size to be inputted into the multiplier 411 is the same as the step size in the first embodiment.

The accumulative adder 412 accumulatively adds an output from the multiplier 411 and finds an average of a skew error between the AD conversion circuits 401A and 401B. The coefficient generation unit 413 generates a coefficient to be set in the adaptive filter 404 according to a skew correction value detected by the accumulative adder 412. By setting the coefficient according to the skew correction value in the adaptive filter 404 in this manner, phase shift (phase adjustment) whether to proceed or delay the phase is performed on the output from the AD conversion circuit 401B, whereby the skew correction between the AD conversion circuits 401A and 401B is performed.

Comparing the skew correction unit 403 illustrated in FIG. 4 with the skew correction unit 112 in the first embodiment illustrated in FIG. 3, the position where the multiplier that performs multiplication by the signal $(-1)^n$ is different, but even if its positional sequence is changed, there is no difference in result in terms of a transfer function.

Also in the second embodiment, using the signal in which the output signal from the AD conversion circuit 401A, 401B is mixed with the signal made by shifting the phase of the output signal from the AD conversion circuit 401A, 401B by $\pi/2$, makes it possible to accurately obtain the skew correction value even when the angular frequency $\omega_{in}$ of the input signal is ¼ of the operating angular frequency $\omega_s$ of the time-interleaved ADC as in the first embodiment. Therefore, it becomes possible to detect the skew error at an arbitrary frequency irrespective of the angular frequency $\omega_{in}$ of the input signal and perform skew correction processing between the AD conversion circuits 401A and 401B. Further, the circuit that generates the signal in which the output signal from the AD conversion circuit 401A, 401B is mixed with the signal made by shifting the phase of the output signal from the AD conversion circuit 401A, 401B by $\pi/2$ and the circuit that performs the skew correction processing are partially made common in the skew correction unit 403, thereby making it possible to suppress an increase in circuit area.

Third Embodiment

Next, a third embodiment will be described.

Figure 5:
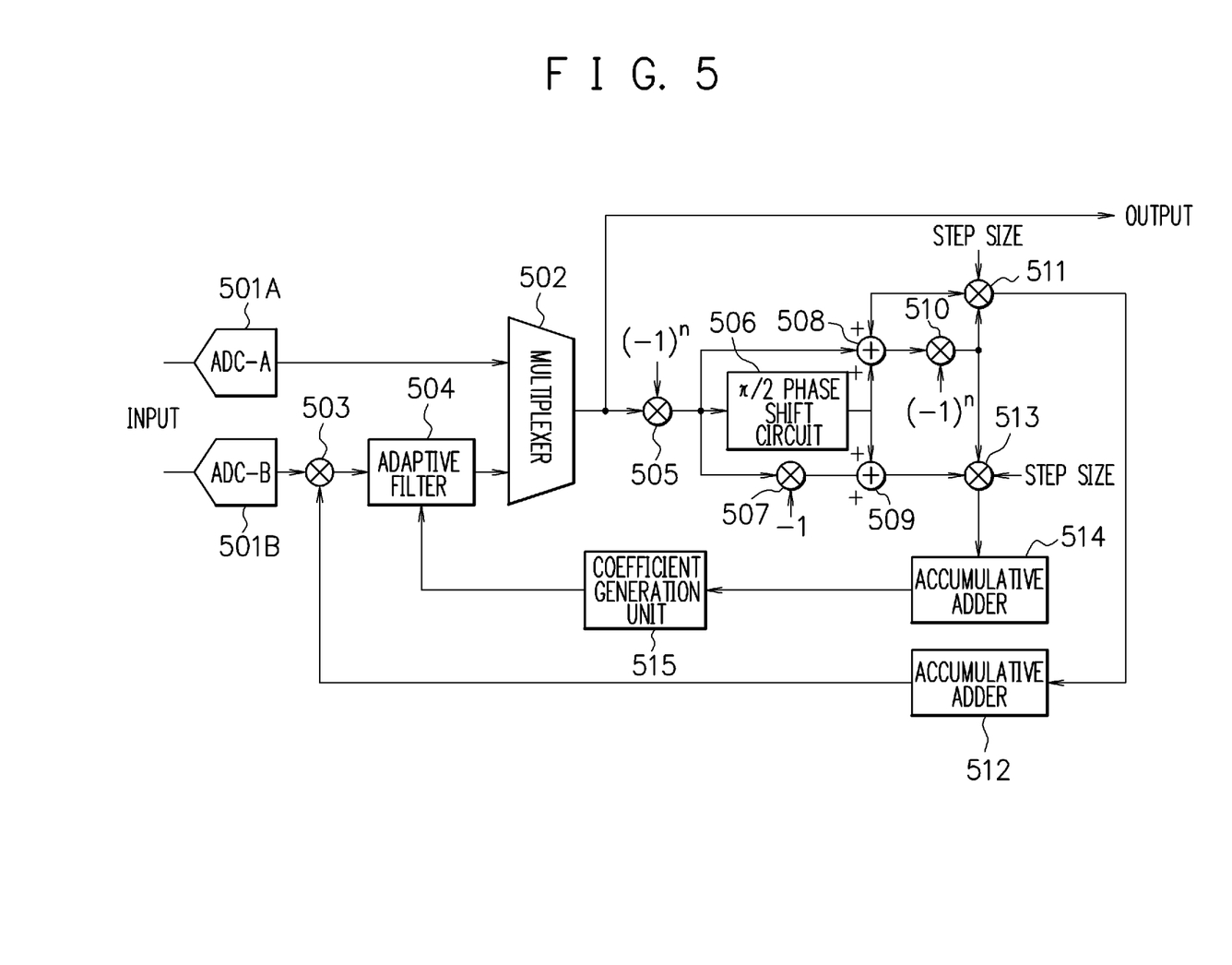
FIG. 5 is a diagram illustrating a configuration example of an analog-to-digital converter according to a third embodiment.

FIG. 5 is a diagram illustrating a configuration example of a time-interleaved ADC according to the third embodiment.

In the time-interleaved ADC according to the third embodiment, a circuit relating to gain correction processing and a circuit relating to skew correction processing commonly use a circuit that generates a signal in which an output signal from an AD conversion circuit is mixed with a signal made by shifting the phase of the output signal by $\pi/2$.

The time-interleaved ADC according to the third embodiment includes a plurality of AD conversion circuits 501A, 501B that convert an analog input signal to a digital output signal in a time-interleaved manner. FIG. 5 illustrates an example of performing gain correction and skew correction for the AD conversion circuit 501B on the basis of the AD conversion circuit 501A. The analog input signal is inputted into each of the AD conversion circuits 501A, 501B as in the first embodiment, and sampled at a sampling frequency fs (angular frequency $\omega_s=2\pi fs$) alternately by the AD conversion circuits 501A, 501B and converted into the digital output signal.

The output signal from the AD conversion circuit 501A is inputted into a multiplexer 502. The output signal from the AD conversion circuit 501B is inputted into the multiplexer 502 via a multiplier 503 and an adaptive filter 504. The multiplexer 502 outputs the output signal from the AD conversion circuit 501A, 501B to a multiplier 505 and outputs the output signal as a digital output signal. The multiplexer 502 selects and outputs the output signal from the AD conversion circuit 501A in the period in which the output signal from the AD conversion circuit 501A is enabled, and selects and outputs the output signal from the AD conversion circuit 501B supplied thereto via the multiplier 503 and the adaptive filter 504 in the period in which the output signal from the AD conversion circuit 501B is enabled.

The multiplier 505 multiplies an output from the multiplexer 502 by a signal $(-1)^n$ that is inverted to +1, −1 every sampling timing n. A $\pi/2$ phase shift circuit 506 shifts the phase of an output from the multiplier 505 by $\pi/2$. A multiplier 507 multiplies the output from the multiplier 505 by a signal (−1). Multiplying by the signal (−1) by the multiplier 507 corresponds to phase shift of $(\pi/2)+(\pi/2)=\pi$ on the output from the multiplier 505 (bringing it into a reverse phase).

An adder 508 adds and outputs the output from the multiplier 505 and an output from the $\pi/2$ phase shift circuit 506. In other words, the adder 508 generates a signal in which the output signal from the AD conversion circuit 501A, 501B is mixed with a signal made by shifting the phase of the output signal from the AD conversion circuit 501A, 501B by $\pi/2$.

An adder 509 adds and outputs the output from the $\pi/2$ phase shift circuit 506 and an output from the multiplier 507. In other words, the adder 509 generates a signal in which the output signal from the AD conversion circuit 501A, 501B whose phase has been shifted by $\pi/2$ is mixed with a signal made by further shifting by $\pi/2$ the phase of the output signal from the AD conversion circuit 501A, 501B whose phase has been shifted by $\pi/2$.

A multiplier 510 multiplies an output from the adder 508 by a signal $(-1)^n$ that is inverted to +1, −1 every sampling timing n. A multiplier 511 multiplies the output from the adder 508 by an output from the multiplier 510. A step size to be inputted into the multiplier 511 is the same as the step size in the first embodiment. An accumulative adder 512 accumulatively adds an output from the multiplier 511 and finds an average of a gain error between the AD conversion circuits 501A and 501B. By controlling the multiplier 503 according to a gain correction value detected by the accumulative adder 512, processing for correcting the gain error is performed on the output from the AD conversion circuit 501B, whereby the gain correction between the AD conversion circuits 501A and 501B is performed.

A multiplier 513 multiplies the output from the multiplier 510 by an output from the adder 509. A step size to be inputted into the multiplier 513 is the same as the step size in the first embodiment. An accumulative adder 514 accumulatively adds an output from the multiplier 513 and finds an average of a skew error between the AD conversion circuits 501A and 501B. A coefficient generation unit 515 generates a coefficient to be set in the adaptive filter 504 according to a skew correction value detected by the accumulative adder 514. By setting the coefficient according to the skew correction value in the adaptive filter 504 in this manner, phase shift (phase adjustment) whether to proceed or delay the phase is performed on the output from the AD conversion circuit 501B, whereby the skew correction between the AD conversion circuits 501A and 501B is performed.

According to the third embodiment, using the signal in which the output signal from the AD conversion circuit 501A, 501B is mixed with the signal made by shifting the phase of the output signal by $\pi/2$, makes it possible to accurately obtain the gain correction value and the skew correction value even when the angular frequency $\omega_{in}$ of the input signal is ¼ of the operating angular frequency $\omega_s$ of the time-interleaved ADC. Therefore, it becomes possible to detect the gain error and the skew error at an arbitrary frequency irrespective of the angular frequency $\omega_{in}$ of the input signal and perform the gain correction processing and the skew correction processing between the AD conversion circuits 501A and 501B. Further, the circuit that generates the signal in which the output signal from the AD conversion circuit is mixed with the signal made by shifting the phase of the output signal by $\pi/2$ is commonly used between the circuit relating to the gain correction processing and the circuit relating to the skew correction processing, thereby eliminating the need to provide complicated circuits in the respective circuit parts and making it possible to further reduce the circuit area.

Fourth Embodiment

Next, a fourth embodiment will be described.

Figure 6:
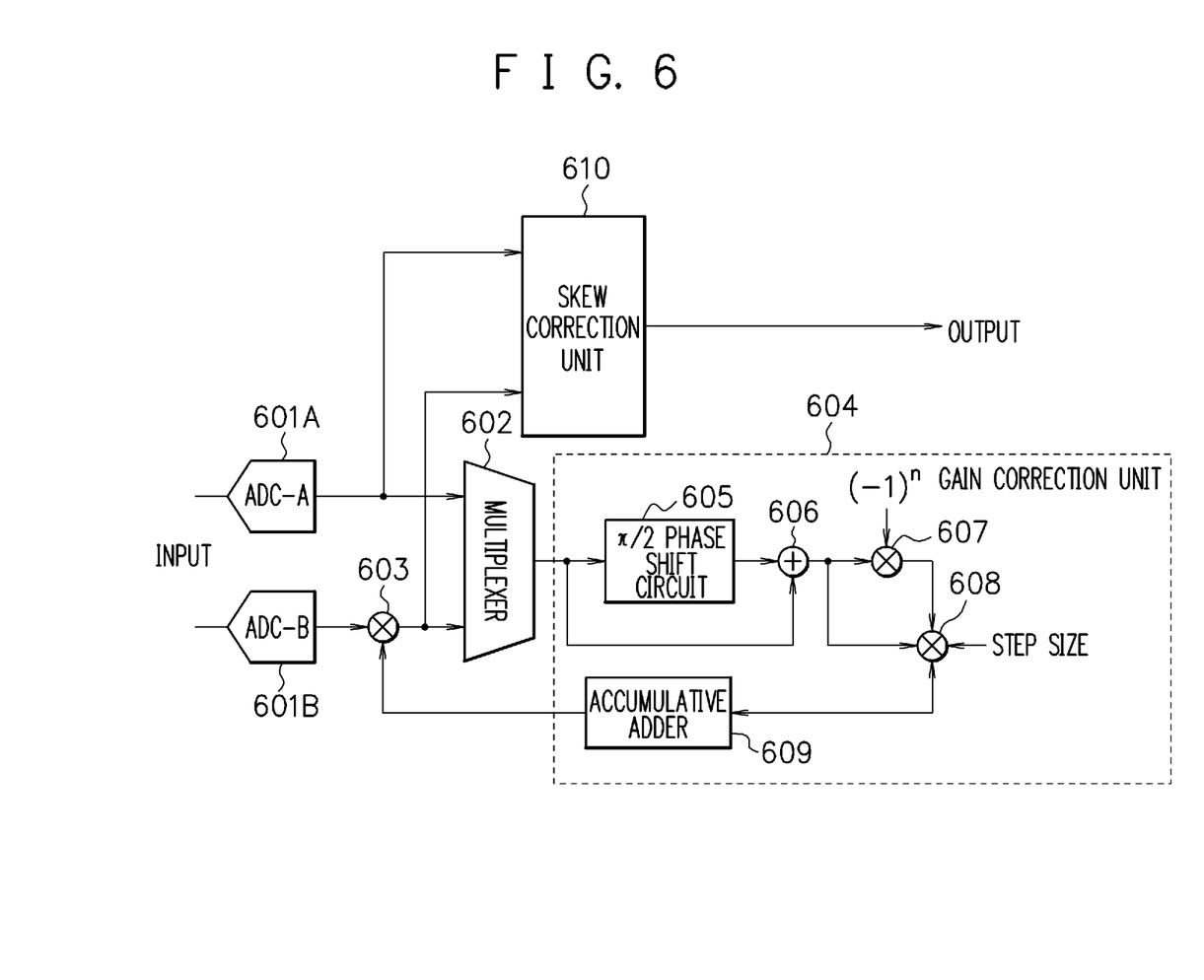
FIG. 6 is a diagram illustrating a configuration example of an analog-to-digital converter according to a fourth embodiment.

FIG. 6 is a diagram illustrating a configuration example of a time-interleaved ADC according to the fourth embodiment. The time-interleaved ADC according to the fourth embodiment is configured to use a signal in which an output signal from an AD conversion circuit is mixed with a signal made by shifting the phase of the output signal by $\pi/2$, only when performing gain correction processing.

The time-interleaved ADC according to the fourth embodiment includes a plurality of AD conversion circuits 601A, 601B that convert an analog input signal to a digital output signal in a time-interleaved manner. FIG. 6 illustrates an example of performing gain correction and skew correction for the AD conversion circuit 601B on the basis of the AD conversion circuit 601A. The skew correction in the fourth embodiment is the same as conventionally performed, so that the skew correction is not performed when the angular frequency $\omega_{in}$ of the input signal is ¼ of the operating angular frequency $\omega_s$ of the time-interleaved ADC.

The analog input signal is inputted into each of the AD conversion circuits 601A, 601B as in the first embodiment, and sampled at a sampling frequency fs (angular frequency $\omega_s = 2\pi fs$) alternately by the AD conversion circuits 601A, 601B and converted into the digital output signal. The output signal from the AD conversion circuit 601A is outputted to a multiplexer 602 and a skew correction unit 610. The output signal from the AD conversion circuit 601B is outputted to the multiplexer 602 and the skew correction unit 610 via a multiplier 603. The multiplexer 602 outputs the output signal from the AD conversion circuit 601A, 601B to a gain correction unit 604.

The gain correction unit 604 includes a $\pi/2$ phase shift circuit 605, an adder 606, multipliers 607, 608, and an accumulative adder 609. The $\pi/2$ phase shift circuit 605 shifts the phase of an output from the multiplexer 602 by $\pi/2$. The adder 606 adds an output from the $\pi/2$ phase shift circuit 605 and the output from the multiplexer 602. In other words, the adder 606 generates a signal in which the output signal from the AD conversion circuit 601A, 601B is mixed with a signal made by shifting the phase of the output signal from the AD conversion circuit 601A, 601B by $\pi/2$.

The multiplier 607 multiplies an output from the adder 606 by a signal $(-1)^n$ that is inverted to +1, −1 every sampling timing n. The multiplier 608 multiplies the output from the adder 606 by an output from the multiplier 607. A step size to be inputted into the multiplier 608 is the same as the step size in the first embodiment. The accumulative adder 609 accumulatively adds an output from the multiplier 608 and finds an average of a gain error between the AD conversion circuits 601A and 601B. By controlling the multiplier 603 according to a gain correction value detected by the accumulative adder 609, processing for correcting the gain error is performed on the output from the AD conversion circuit 601B, whereby the gain correction between the AD conversion circuits 601A and 601B is performed.

The skew correction unit 610 is the same as the skew correction unit 803 illustrated in FIG. 8, and performs the skew correction on the output signal from the AD conversion circuit 601A, 601B supplied thereto and outputs a digital output signal.

According to the fourth embodiment, using the signal in which the output signal from the AD conversion circuit 601A, 601B is mixed with the signal made by shifting the phase of the output signal by $\pi/2$, makes it possible to accurately obtain the gain correction value even when the angular frequency $\omega_{in}$ of the input signal is ¼ of the operating angular frequency co, of the time-interleaved ADC. Therefore, it becomes possible to detect the gain error at an arbitrary frequency irrespective of the angular frequency $\omega_{in}$ of the input signal and perform the gain correction processing between the AD conversion circuits 601A and 601B. Further, the circuit that generates the signal in which the output signal from the AD conversion circuit 601A, 601B is mixed with the signal made by shifting the phase of the output signal by $\pi/2$ and the circuit that performs the gain correction processing are partially made common in the gain correction unit 604, thereby making it possible to suppress an increase in circuit area.

Note that the time-interleaved ADCs each including two AD conversion circuits are illustrated in the above-described first to fourth embodiments, but the time-interleaved ADC is not limited to these. Any number of AD conversion circuits may be included in the time-interleaved ADC. For example, in the case where N AD conversion circuits are included, the AD conversion circuits only need to perform sampling at timings shifted from one another by a cycle of the sampling frequency fs and in a cycle of N times the sampling frequency fs, and convert the analog input signal into a digital output signal in a time-interleaved manner. Further, it is to provide correction circuits that perform the gain correction processing and the skew correction processing respectively in the AD conversion circuit regarded as a basis so as to perform the gain correction and the skew correction between the AD conversion circuits.

Figure 7:
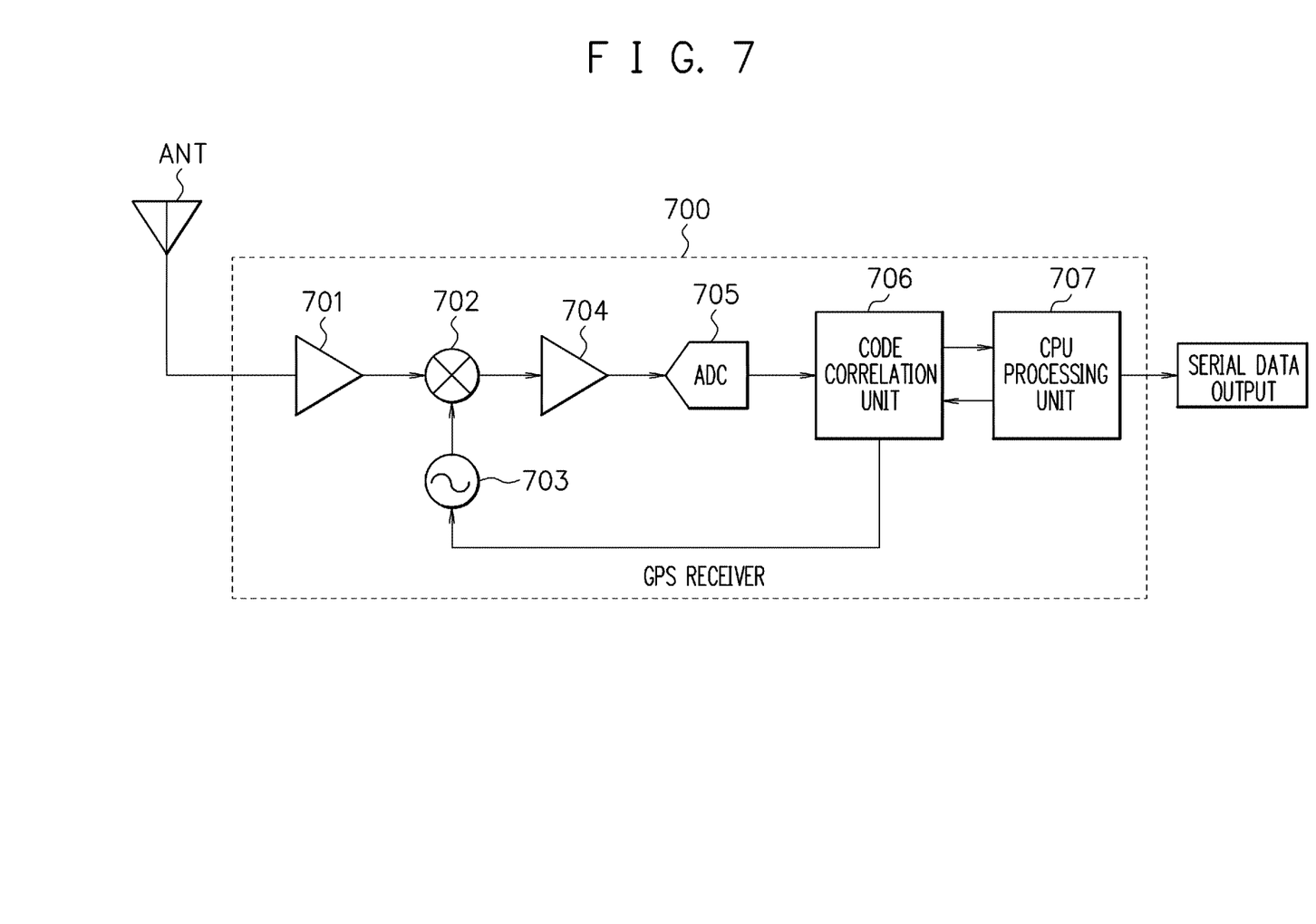
FIG. 7 is a diagram illustrating a configuration example of a semiconductor integrated circuit including an analog-to-digital converter according to a present embodiment.

FIG. 7 is a diagram illustrating a configuration example of a semiconductor integrated circuit including a time-interleaved ADC according to a present embodiment. FIG. 7 illustrates an example in which the time-interleaved ADC according to this embodiment is applied to a GPS (Global Positioning System) receiver 700.

An antenna ANT is a GPS antenna that receives a radio wave transmitted from a GPS satellite and includes a low-noise preamplifier (LNA) therein. A high-frequency amplifier 701 amplifies a signal received by the antenna ANT. A mixer (frequency converter) 702 converts the received radio wave (RF signal) into an intermediate frequency (IF) signal using an oscillation signal supplied from a local oscillator 703. An intermediate frequency amplifying unit 704 amplifies the intermediate frequency (IF) signal outputted from the mixer 702.

An ADC 705 is the time-interleaved ADC in this embodiment, and converts an analog signal outputted from the intermediate frequency amplifying unit 704 into a digital signal in a time-interleaved manner and outputs it. A code correlation unit 706 performs comparison with a C/A code unique to each satellite and performs code demodulation. A CPU processing unit 707 demodulates a C/A code to create, for example, navigation message data containing orbit data of satellite required for calculation of its position and various kinds of correction data.

The disclosed analog-to-digital converter can detect an error even when the frequency of an input signal is ¼ of a sampling frequency and perform correction processing, and thereby perform correction processing on the error at an arbitrary frequency.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analog-to-digital converter configured to sample an analog input signal at a sampling frequency and to convert the analog input signal into a digital output signal, the analog-to-digital converter comprising:

a plurality of analog-to-digital conversion circuits configured to convert the analog input signal into the digital output signal in a time-interleaved manner; and a correction circuit configured to perform gain correction processing with respect to the analog-to-digital conversion circuit, on the basis of a mixed signal, the mixed signal being obtained by mixing an output signal from the analog-to-digital conversion circuit with a signal made by shifting a phase of the output signal by π/2, wherein the correction circuit includes a gain correction circuit configured to detect a gain correction value on the basis of the mixed signal, and to perform correction processing on a gain error between the plurality of analog-to-digital conversion circuits, on the basis of the gain correction value.

2. The analog-to-digital converter according to claim 1, wherein the correction circuit includes:

a signal generation circuit configured to generate the mixed signal.

3. The analog-to-digital converter according to claim 2, wherein the gain correction circuit performs the correction processing on the gain error by multiplying the output signal from at least one of the plurality of analog-to-digital conversion circuits by the gain correction value.

4. The analog-to-digital converter according to claim 2, wherein the correction circuit configured to perform the gain correction processing and skew correction processing with respect to the analog-to-digital conversion circuit on the basis of the mixed signal, and the correction circuit further includes a skew correction circuit configured to detect a skew correction value on the basis of the mixed signal generated by the signal generation circuit, and to perform correction processing on a skew between the plurality of analog-to-digital conversion circuits, on the basis of the skew correction value.

5. The analog-to-digital converter according to claim 4, wherein the skew correction circuit performs the correction processing on the skew by shifting a phase of the output signal from at least one of the plurality of analog-to-digital conversion circuits in accordance with the skew correction value.

6. The analog-to-digital converter according to claim 1, wherein the gain correction circuit is further configured to generate the mixed signal.

7. The analog-to-digital converter according to claim 6, wherein the gain correction circuit performs the correction processing on the gain error by multiplying the output signal from at least one of the plurality of analog-to-digital conversion circuits by the gain correction value.

8. A semiconductor integrated circuit, comprising:

an analog-to-digital converter configured to sample an analog input signal at a sampling frequency and to convert the analog input signal into a digital output signal; and a processing circuit configured to perform signal processing on the digital output signal, wherein the analog-to-digital converter includes:

a plurality of analog-to-digital conversion circuits configured to convert the analog input signal into the digital output signal in a time-interleaved manner; and a correction circuit configured to perform gain correction processing with respect to the analog-to-digital conversion circuit, on the basis of a mixed signal, the mixed signal being obtained by mixing an output signal from the analog-to-digital conversion circuit with a signal made by shifting a phase of the output signal by π/2, wherein the correction circuit includes a gain correction circuit configured to detect a gain correction value on the basis of the mixed signal, and to perform correction processing on a gain error between the plurality of analog-to-digital conversion circuits, on the basis of the gain correction value.

9. The semiconductor integrated circuit according to claim 8, wherein the correction circuit includes:

a signal generation circuit configured to generate the mixed signal.

10. The semiconductor integrated circuit according to claim 9, wherein the gain correction circuit performs the correction processing on the gain error by multiplying the output signal from at least one of the plurality of analog-to-digital conversion circuits by the gain correction value.

11. The semiconductor integrated circuit according to claim 9, wherein the correction circuit configured to perform the gain correction processing and skew correction processing with respect to the analog-to-digital conversion circuit on the basis of the mixed signal, and the correction circuit further includes a skew correction circuit configured to detect a skew correction value on the basis of the mixed signal generated by the signal generation circuit, and to perform correction processing on a skew between the plurality of analog-to-digital conversion circuits, on the basis of the skew correction value.

12. The semiconductor integrated circuit according to claim 11, wherein the skew correction circuit performs the correction processing on the skew by shifting a phase of the output signal from at least one of the plurality of analog-to-digital conversion circuits in accordance with the skew correction value.

13. The semiconductor integrated circuit according to claim 8, wherein the gain correction circuit is further configured to generate the mixed signal.

14. The semiconductor integrated circuit according to claim 13, wherein the gain correction circuit performs the correction processing on the gain error by multiplying the output signal from at least one of the plurality of analog-to-digital conversion circuits by the gain correction value.

15. An analog-to-digital conversion method for an analog-to-digital converter that comprises a plurality of analog-to-digital conversion circuits and samples an analog input signal at a sampling frequency and converts the analog input signal into a digital output signal, the analog-to-digital conversion method comprising:

converting, by the plurality of analog-to-digital conversion circuits, the analog input signal into the digital output signal in a time-interleaved manner;

generating a mixed signal, the mixed signal being obtained by mixing an output signal from the analog-to-digital conversion circuit with a signal made by shifting a phase of the output signal by 712; and performing gain correction processing with respect to the analog-to-digital conversion circuit, on the basis of the mixed signal, wherein the performing gain correction processing includes:
  detecting a gain correction value on the basis of the mixed signal, and
  performing correction processing on a gain error between the plurality of analog-to-digital conversion circuits, on the basis of the gain correction value.

16. The analog-to-digital conversion method according to claim 15, further comprising
performing skew correction processing with respect to the analog-to-digital conversion circuit, on the basis of the mixed signal,
wherein the performing skew correction processing includes:
  detecting a skew correction value on the basis of the mixed signal; and
  performing correction processing on a skew between the plurality of analog-to-digital conversion circuits, on the basis of the skew correction value.

* * * * *